United States Patent [19]

Nguyen

[11] Patent Number: 5,801,593
[45] Date of Patent: Sep. 1, 1998

[54] VOLTAGE-CONTROLLED OSCILLATOR CAPABLE OF OPERATING AT LOWER POWER SUPPLY VOLTAGES

[75] Inventor: Phong Thanh Nguyen, Pleasanton, Calif.

[73] Assignee: Exar Corporation, Fremont, Calif.

[21] Appl. No.: 766,058

[22] Filed: Dec. 16, 1996

[51] Int. Cl.[6] .................................. H03B 5/24; H03B 5/04
[52] U.S. Cl. ...................... 331/113 R; 331/144; 331/175; 331/177 R
[58] Field of Search ........................ 331/34, 113 R, 331/144, 175, 177 R

[56] References Cited

U.S. PATENT DOCUMENTS 5,357,220  10/1994  Francis ..................... 331/113 R

OTHER PUBLICATIONS

Alan B. Grebene, *Bipolar and MOS Analog Integrated Circuit Design*, Chapter 11, Part 1, "Integrated–Circuit Oscillators and Timers" pp. 543–591, John Wiley & Sons (1994).

*Primary Examiner*—David Mis
*Attorney, Agent, or Firm*—Townsend and Townsend and Crew LLP

[57] ABSTRACT

An improved voltage controlled oscillator circuit is based on a multivibrator design with an internal gain stage to permit low voltage operation. An internal gain stage maintains a loop gain of greater than one to ensure oscillation even at power supply voltages as low as 2.7 volts. The added gain allows the use of resistors inserted on either sides of a timing capacitor for improved linearity.

8 Claims, 2 Drawing Sheets

1

VOLTAGE-CONTROLLED OSCILLATOR CAPABLE OF OPERATING AT LOWER POWER SUPPLY VOLTAGES

BACKGROUND OF THE INVENTION

The present invention relates in general to voltage controlled oscillators (VCOs), and in particular to an improved VCO circuit that is capable of operating at lower supply voltages.

One class of voltage controlled oscillators uses emitter-coupled multivibrator circuits. FIG. 1 shows an example of a voltage controlled oscillator using an emitter-coupled multivibrator circuit. This circuit operates based on the constant-current charging and discharging of the capacitor C1. The frequency of operation is controlled by the voltage $V_c$ that adjusts the amount of charge/discharge current. The circuit includes a pair of gain stages made up of transistors Q1 and Q2. To ensure the occurrence of the regenerative action that causes the oscillation, the gain stages must be designed for a gain of greater than one. An important performance characteristic of the voltage controlled oscillator is its linearity. One way to improve linearity of this oscillator is to insert two resistors R1 and R2 on either sides of the capacitor C1. This, however, reduces the gain of the Q1 and Q2 gain stages, which may lead to start-up problems. That is, the resistors may reduce the loop gain to sufficiently low levels that the feedback circuit fails to regenerate the charge signal, resulting in no oscillation. A similar problem may occur when the power supply voltage is reduced. The impact of reduced power supply voltage is also to reduce the gain of the Q1 and Q2 stages which may lead to start-up problems.

It is therefore desirable to provide a linear multivibrator-based voltage controlled oscillator capable of operating at lower power supply voltages.

SUMMARY OF THE INVENTION

The present invention provides a voltage controlled oscillator that is guaranteed to start oscillation upon power up. The circuit includes resistors to improve linearity but inserts additional gain in the loop to ensure oscillation even at lower power supply voltages.

Accordingly, in one embodiment, the present invention provides a multivibrator voltage controlled oscillator circuit including first and second gain stages biased by corresponding first and second matched current source elements. A control terminal of the first and second matched current source elements connects to a control voltage. A third differential gain stage couples between the first and the second gain stage. The circuit further includes a timing capacitor that couples current-carrying terminals of the first and second gain stages together. The additional gain provided by the third differential gain stage provides sufficient overall gain to ensure oscillation upon power up, and to allow the use of linearity resistors.

A better understanding of the nature and advantage of the circuit of the present invention may be had with reference to the following detailed description and the accompanying diagrams.

DESCRIPTION OF SPECIFIC EMBODIMENTS

Figure 1:
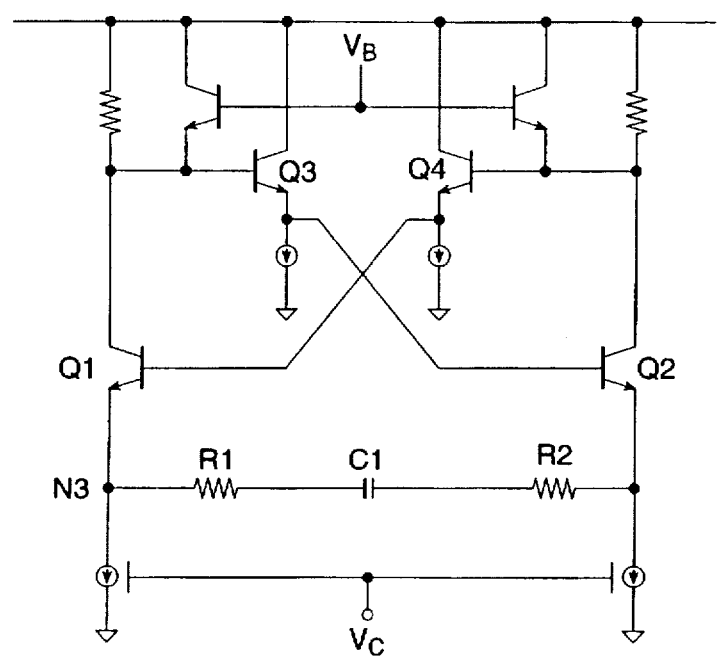
FIG. 1 is a circuit schematic of a prior art multivibrator-based voltage controlled oscillator.
Figure 2:
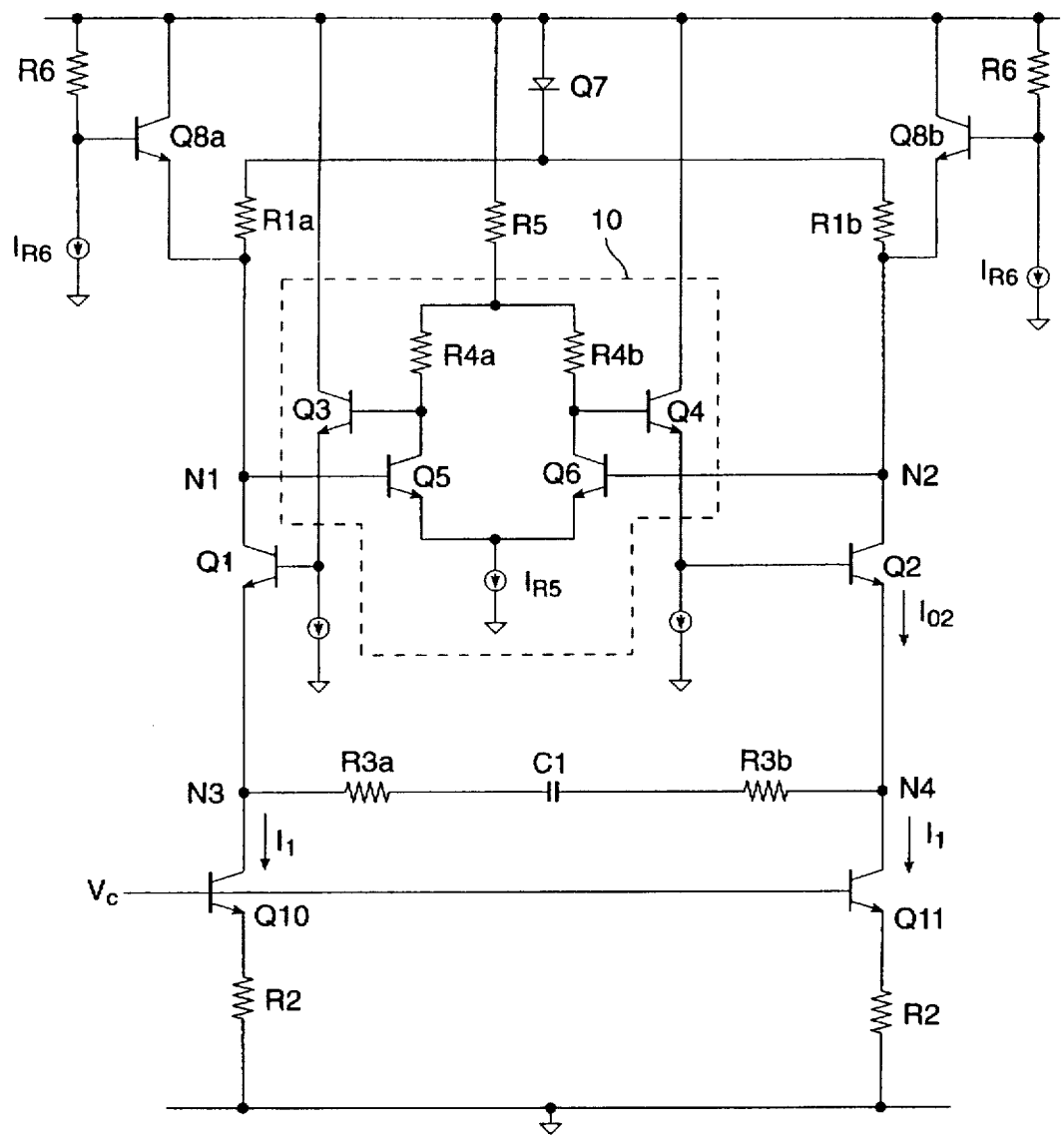
FIG. 2 is one circuit embodiment of the voltage controlled oscillator of the present invention.

Referring to FIG. 2, there is shown a circuit embodiment of the voltage controlled oscillator of the present invention. Two primary gain elements Q1 and Q2 with load resistors R1a and R1b are biased by a pair of matched current source transistors Q10 and Q11. The oscillator control voltage drives the base terminals of transistors Q10 and Q11. Degeneration resistors R2 connect the emitter terminals of current source transistors Q10 and Q11 to ground to improve the matching between the two current sources. The emitter terminals of the gain elements Q1 and Q2 couple together via a timing capacitor C1 with resistors R3a and R3b on either side. A differential gain stage 10 connects to the two gain elements Q1 and Q2. The gain stage 10 includes a differential pair of input transistors Q5 and Q6 with load resistors R4. The outputs of the differential gain stage 10 connect to the base terminals of primary gain transistors Q1 and Q2 via emitter-follower buffer transistors Q3 and Q4, respectively. The base terminals of the differential pair of input transistors Q5 and Q6 connect to the collector terminals of gain transistors Q1 and Q2 at nodes N1 and N2, respectively. Diode-connected transistor Q7 connects the load resistors R1 to the power supply voltage Vcc. Transistors Q8a and Q8b and resistors R6 operate to clamp the voltage across the load resistors R1 to a predefined value.

The circuit operates to ensure that only one of the gain transistors Q1 or Q2 is on (i.e., conducting) at any given time. The matched current sources Q10 and Q11 are designed to draw an identical amount of current I1. Assuming that initially Q1 is off and Q2 is on, Q2 must supply an amount of current $I_{Q2}$ twice that of I1; one I1 current flows through Q11 and a second I1 current through Q10 via C1. With $I_{Q2}$ flowing through R1b and no current flowing through R1a, the voltage at node N1 is at a high voltage and the voltage at node N2 is lowered. When the voltage at node N2 reaches [Vcc−$I_{R6}$R6−$V_{be8}$], transistor Q8b turns on, clamping node N2 at this voltage. The voltage differential at nodes N1 and N2 also causes the differential input transistor Q6 to turn off and transistor Q5 to turn on. Therefore, all of the current $I_{RS}$ flows through resistors R5 and R4a. The potential at the emitter of transistor Q2 (node N4) is given by:

$$V(N4)=Vcc-I_{R5}R5-V_{be4}-V_{be2}$$

Thus, with Q1 off and Q2 on, the current I1 charges the timing capacitor C1 through node N4. The charging of C1 through node N4 causes the potential at node N3 to ramp down. When the voltage at node N3 reaches [Vcc−$I_{R5}$R5−$I_{R5}$R4−$V_{be3}$−$V_{be1}$], the base-emitter junction of transistor Q1 is turned on causing transistor Q1 to start to conduct. Once transistor Q1 starts to conduct current, the voltage at node N1 decreases causing transistor Q5 to turn off and transistor Q6 to turn on. With transistor Q6 conducting, the voltage at the base terminal of transistor Q2 is reduced by an amount equal to [$I_{R5}$R4]. This causes transistor Q2 to turn off, resulting in a change of state for the circuit. The timing capacitor C1 now discharges at the same rate (I1) but in the opposite direction. This continues until the voltage at node N4 ramps down to a low enough voltage level to turn transistor Q2 back on, and reverse the state of the circuit. The total voltage swing across the timing capacitor C1 is therefore equal to ($2I_{R5}$R4−2I1R1) for each half cycle of the operation. In this manner, the cycle of charging and discharging the timing capacitor with a constant current I1 repeats itself regeneratively.

For fully symmetrical operation, resistors R4, R5, and R6 are designed to have identical resistance R, with identical current sources $I_{R5}$ and $I_{R6}$ of current $I_R$. Thus, the half period of oscillation is given by the time required to charge the timing capacitor C1:

$$T/2=Q/I=[C1(2I_R R-2I1R1)]/I1$$

Accordingly, the frequency of oscillation is given by:

$$f=1/T=I1/[4C1(I_R R-I1R1)]$$

By varying the control voltage at the base terminals of current source transistors Q10 and Q11, the value of I1 and therefore the frequency of oscillation can be adjusted.

An advantage of the voltage controlled oscillator of the present invention is the inclusion of gain stage 10 which assures proper low voltage operation. The gain stage 10 can be designed for a gain of for example 2 between nodes N1 and N3, and nodes N2 and N4. This guarantees oscillation immediately upon power up.

Referring to FIG. 2, in one half cycle of operation transistors Q1 and Q3 are on and Q5 is off. Thus, the minimum required voltage for proper operation between Vcc and ground is given by:

$$Vmin=2V_{be}+I_R R+V_{C1}+V_{ce(11)}+I1R2$$

This is approximately equal to:

$$Vmin=2(0.7\ v)+0.3\ v+0.2\ v+0.2\ v=2.4\ v$$

Thus, the voltage controlled oscillator of the present invention can operate with power supply voltages as low as 2.7 v (i.e., 3 v−10%) with a 0.3 volt margin. The loop gain of 2 introduced by the internal differential gain stage 10 provides sufficient gain for accurate and reliable operation of the circuit at the lower power supply voltages.

In conclusion, the present invention provides an improved voltage controlled oscillator circuit that is capable of operating at lower power supply voltages. While the above provides a complete description of a specific embodiment of the present invention, it is possible to use various alternatives, modifications or equivalents. For example, while the embodiment described uses bipolar transistor technology, it is possible to design a metal-oxidesemiconductor (MOS) voltage controlled oscillator based on the inventive concept. Therefore, the scope of the present invention should be determined not with reference to the above description, but, instead, should be determined with reference to the appended claims and their full scope of equivalents.

What is claimed is:

1. A voltage controlled oscillator circuit comprising:

a first and a second gain element each having an input terminal, an output terminal and a bias terminal;

a first voltage controlled current source coupled to said bias terminal of said first gain element;

a second voltage controlled current source coupled to said bias terminal of said second gain element;

a differential gain stage having first and second differential input terminals and first and second differential output terminals, said first and second differential input terminals being coupled to said output terminals of said first and second gain elements, respectively, and said first and second differential output terminals being coupled to said first and second input terminals of said first and second gain elements, respectively;

a timing capacitor coupled between said bias terminals of said first gain element and said second gain element;

first and second clamp circuits coupled to said output terminals of said first and second gain elements, respectively;

a first resistor coupled between said timing capacitor and said bias terminal of said first gain element; and a second resistor coupled between said timing capacitor and said bias terminal of said second gain element, wherein, said differential gain stage comprises:

a differential pair of input transistors having input terminals coupled to said first and second differential input terminals;

a pair of load devices coupling said differential pair of input transistors to a power supply voltage, respectively; and a current source device coupled to said differential pair of input transistors for biasing said differential gain stage, and wherein said differential gain stage further comprises a first output buffer transistor coupled to said first differential output terminal and a second output buffer transistor coupled to said second differential output terminal.

2. The voltage controlled oscillator circuit of claim 1 wherein said circuit is implemented in bipolar technology where said output buffers are emitter-follower bipolar transistors.

3. The voltage controlled oscillator circuit of claim 2 further comprising a first degeneration resistor coupled between ground and an emitter terminal of said first voltage controlled current source, and a second degeneration resistor coupled between around and an emitter terminal of said second voltage controlled current source.

4. The voltage controlled oscillator circuit of claim 1 wherein each of said first and second gain elements includes a load device coupling a gain transistor to the power supply voltage.

5. A voltage controlled oscillator circuit comprising:

a first gain stage having a first bipolar transistor with a collector terminal coupled to a power supply voltage through a first load device, and a first level shift device, an emitter terminal coupled to ground through a first voltage controlled current source transistor, and a base terminal;

a second gain stage having a second bipolar transistor with a collector terminal coupled to a power supply voltage through a second load device, and said first level shift device, an emitter terminal coupled to ground through a second voltage controlled current source transistor, and a base terminal;

a differential gain stage having a differential pair of transistors with common emitters coupled to a current source device, a base terminal of each of said differential pair of transistors being coupled to a respective one of said collector terminals of said first and second bipolar transistors, and a collector terminal of each of said differential pair of transistors being coupled to a respective one of said base terminals of said first and second bipolar transistors, said differential gain stage further comprising a pair of load devices respectively coupling said collector terminal of each of said differential pair of transistors to a power supply voltage via a second level shift device; and a timing capacitor coupled between said emitter terminal of said first bipolar transistor and said emitter terminal of said second bipolar transistor.

6. The voltage controlled oscillator circuit of claim 5 further comprising:

first and second emitter-follower transistors respectively coupled between said collector terminals of said differential pair of transistors and said base terminals of said first and second bipolar transistors; and first and second clamp circuits respectively coupling said collector terminals of said first and second bipolar transistors to the power supply voltage.

7. The voltage controlled oscillator circuit of claim 6 further comprising a first resistor coupled between said timing capacitor and said emitter terminal of said first bipolar transistor, and a second resistor coupled between said timing capacitor and said emitter terminal of said second bipolar transistor.

8. A voltage controlled oscillator circuit comprising:

a first and a second gain element each having an input terminal, an output terminal, and a bias terminal;

a first voltage controlled current source coupled to said bias terminal of said first gain element;

a second voltage controlled current source coupled to said bias terminal of said second gain element;

a differential gain stage having first and second differential input terminals, first and second differential output terminals, and first and second buffer transistors, said first and second differential input terminals being coupled to said output terminals of said first and second gain elements, respectively, and said first and second buffer transistors being coupled between said first and second differential output terminals and said first and second input terminals of said first and second gain elements, respectively;

a timing capacitor coupled between said bias terminals of said first gain element and said second gain elements; and first and second clamp circuits coupled to said output terminals of said first and second gain elements, respectively.

* * * * *